United States Patent
Webb et al.

(10) Patent No.: US 7,843,248 B1
(45) Date of Patent: Nov. 30, 2010

(54) ANALOG SWITCH WITH OVERCURRENT DETECTION

(75) Inventors: Robert W. Webb, Palm Bay, FL (US); Douglas L. Youngblood, Palm Bay, FL (US); Roger Levison, Los Gatos, CA (US)

(73) Assignee: Intersil Americas Inc., Milpitas, CA (US)

( * ) Notice: Subject to any disclaimer, the term of this patent is extended or adjusted under 35 U.S.C. 154(b) by 1 day.

(21) Appl. No.: 12/235,274

(22) Filed: Sep. 22, 2008

Related U.S. Application Data

(60) Provisional application No. 60/984,490, filed on Nov. 1, 2007.

(51) Int. Cl.
*H03K 17/56* (2006.01)

(52) U.S. Cl. .................. 327/419; 361/93.2; 361/93.9

(58) Field of Classification Search ............... 361/93.1, 361/93.2, 93.9
See application file for complete search history.

(56) References Cited

U.S. PATENT DOCUMENTS

| | | | | |
|---|---|---|---|---|
| 4,429,339 A | * | 1/1984 | Jaeschke et al. | 361/93.7 |
| 4,492,913 A | * | 1/1985 | Arnold et al. | 323/282 |
| 4,547,828 A | * | 10/1985 | Bloomer | 361/86 |
| 4,620,258 A | * | 10/1986 | Bloomer | 361/91.2 |
| 4,849,850 A | * | 7/1989 | Brahms | 361/101 |
| 5,184,272 A | * | 2/1993 | Suda et al. | 361/87 |
| 5,428,287 A | * | 6/1995 | Agiman | 323/284 |
| 5,621,601 A | * | 4/1997 | Fujihira et al. | 361/93.9 |
| 6,624,994 B1 | * | 9/2003 | Schmoock et al. | 361/93.1 |
| 7,248,452 B2 | * | 7/2007 | Ohshima | 361/93.1 |
| 7,656,632 B2 | * | 2/2010 | Tsuchihashi | 361/93.1 |
| 2006/0077606 A1 | * | 4/2006 | Nakamura | 361/93.1 |
| 2006/0152874 A1 | * | 7/2006 | Young | 361/93.1 |
| 2007/0014065 A1 | * | 1/2007 | Iimura et al. | 361/93.1 |
| 2007/0103832 A1 | * | 5/2007 | Ohshima | 361/93.1 |
| 2007/0247774 A1 | * | 10/2007 | Cheng et al. | 361/93.1 |
| 2007/0268642 A1 | * | 11/2007 | Metayer et al. | 361/93.1 |

* cited by examiner

*Primary Examiner*—Lincoln Donovan
*Assistant Examiner*—William Hernandez
(74) *Attorney, Agent, or Firm*—Gary R. Stanford

(57) ABSTRACT

A switch circuit including a first switch, a reference device, a current generating device and a comparator. The first switch has a first resistance and develops a first voltage when a first current is provided through it. The reference device has a second resistance which is a known multiple of the first resistance. The current generating device provides a reference current through the reference device which develops a second voltage having a level indicative of a maximum current level of the first current. The comparator compares the first and second voltages and provides a maximum current indication. An amplifier may be used to force one side of the first switch and the reference device to the same voltage, where the reference device is coupled between an input and an output of the amplifier. The switch circuit may include a calibration mode.

18 Claims, 1 Drawing Sheet

ANALOG SWITCH WITH OVERCURRENT DETECTION

CROSS-REFERENCE TO RELATED APPLICATIONS

This application claims the benefit of U.S. Provisional Application Ser. No. 60/976,868, filed on Oct. 2, 2007, which is herein incorporated by reference for all intents and purposes.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

It is desired to determine if and when the current through a switch, such as an analog switch or the like, has exceeded a predetermined limit, such as an overcurrent level or a predetermined maximum current level or the like. Conventional designs often use a resistive device coupled in series with the switch to measure current. The series resistance, however, increases the effective resistance of the switch providing undesirable results. It is desired to determine whether the current through the switch exceeds a predetermined level without increasing the effective resistance of the switch.

Figure 1:
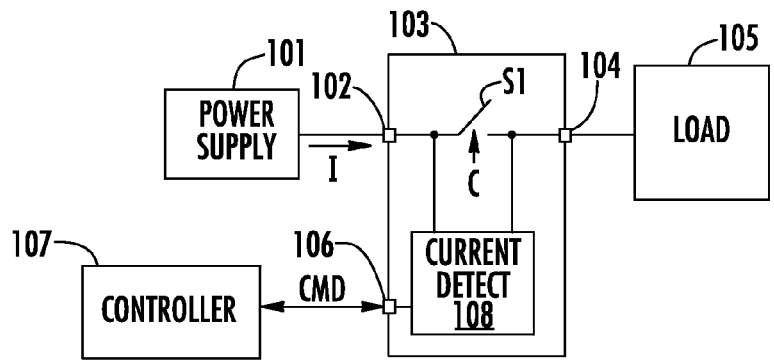
FIG. 1 is a simplified block diagram of a switch circuit implemented according to an exemplary embodiment used to couple a load to the output of a power supply and to detect an over current condition.

FIG. 1 is a simplified block diagram of a switch circuit 103 implemented according to an exemplary embodiment used to couple a load 105 to the output of a power supply 101 and to detect an over current condition. The output of the power supply 101 is coupled to a terminal 102 and the load 105 is coupled to another terminal 104 of the switch circuit 103. The switch circuit 103 includes an internal switch S1 having an input end coupled to the terminal 102 and an output end coupled to the terminal 104. The switch S1 is shown as a single-pole, single-throw (SPST) switch having a pair of switched terminals coupled between the terminals 102 and 104 and having a control terminal receiving a control signal C. Although a SPST switch is shown for purposes of illustration, it is understood that any type of electronic switch may be used, such as a metal-oxide semiconductor (MOS) switch or field-effect transistor (FET) switch or the like. The state of the switch S1 is controlled by the C signal for opening and closing the switch S1 to selectively couple the power supply 101 to the load 105. When the switch S1 is closed, a load current I develops from the power supply 101 to the load 105 through the switch S1. It is desired to determine when the load current I exceeds a predetermined value.

The switch circuit 103 further includes an internal current detect circuit 108 coupled across the switch S1 between the terminals 102 and 104 of the switch circuit 103 and further coupled to another terminal 106 of the switch circuit 103. The terminal 106 is shown coupled to a controller 107 via a bidirectional command interface (CMD). The controller 107 and the switch circuit 103 communicate with each other via the command interface. In one embodiment, for example, the controller 107 provides commands to control operation of the switch circuit 103 and the switch circuit 103 provides information back to the controller 107. As further described below, the controller 107 programs the switch circuit 105 with a value indicative of the maximum value of the load current I. If and when the load current I exceeds the programmed maximum value, the switch circuit 103 informs the controller 107 via the command interface. In a more particular embodiment, the command interface is a serial interface or the like. The command interface may be a digital or analog interface.

The switch S1 may be implemented in any suitable manner for selectively coupling the output of the power supply 101 to the load 104. In one embodiment, the switch S1 is a pair of complementary metal-oxide semiconductor, field-effect transistors (MOSFETs) coupled in parallel between the terminals 102 and 104. The pair of MOSFET switches may be configured as an N-channel device and a P-channel device each having drains and sources coupled together as understood by those skilled in the art. The gates of the devices are driven by a gate drive buffer circuit or the like (not shown) having buffer devices with the appropriate polarity for biasing the P-channel and N-channel devices on or off with each buffer device having an input receiving the C signal. The gate drive buffer circuit performs the action of closing the switch S1 and effectively coupling the terminals 102 and 104 together. In one embodiment, the switch circuit 103 is implemented as an integrated die or integrated circuit (IC) with the terminals 102, 104 and 106 configured as interface pins or connectors or the like.

Figure 2:
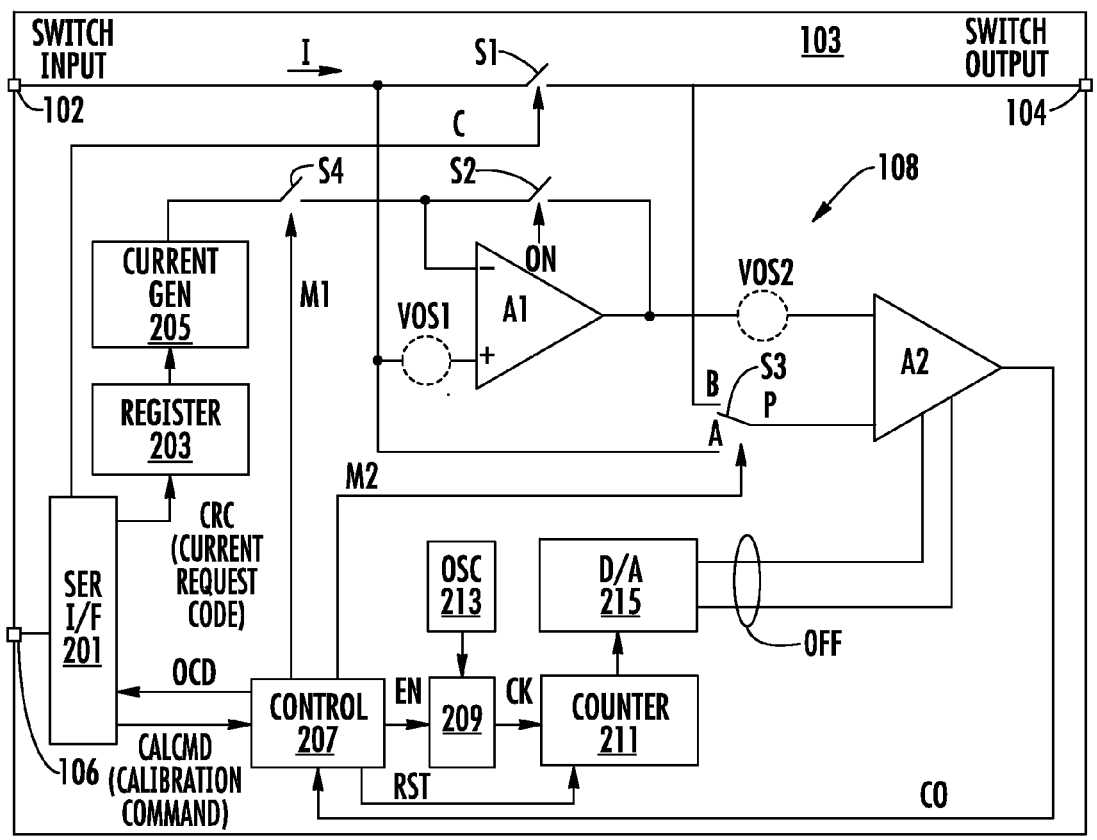
FIG. 2 is a more detailed block diagram of the switch circuit of FIG. 1.

FIG. 2 is a more detailed block diagram of the switch circuit 103 according to an exemplary embodiment which includes the switch S1 and the current detect circuit 108. The switch circuit 103 further includes a serial interface circuit 201 coupled to the terminal 106 for communicating with the controller 107. A serial interface is illustrated although other types of interfaces are contemplated, including any type of digital or analog interface or any type of serial or parallel interface or the like. The terminal 106 is thus a communication terminal for enabling communications with the switch circuit 103. In the illustrated embodiment, the serial interface circuit 201 asserts the C signal to control the state of the switch S1. The serial interface circuit 201 further provides a current request code (CRC) signal and a calibration command (CALCMD) signal. The terminal 102 is internally coupled to one terminal of an offset voltage source VOS1 and to switched terminal A of a controlled single-pole, double-throw (SPDT) switch S3 with two switched terminals A and B and a common pole P. The other terminal 104 of the switch circuit 103 is coupled to the switched terminal B of the switch S3. The common pole P of the switch S3 is coupled to one input of a comparator A2. The other terminal of the offset voltage source VOS1 is coupled to a first input (e.g., non-inverting input) of an amplifier A1. The second input (e.g., inverting input) of the amplifier A1 is coupled to a first switched terminal of a "metering" switch S2, shown as a SPST switch having a control terminal receiving a signal ON. The switch S2 is a matched and scaled version of the switch S1 as further described below. The second switched terminal of the switch S2 is coupled to the output of the amplifier A1 and to one terminal of another offset voltage source VOS1, which has its other terminal coupled to another input of the comparator A2. In one embodiment, the ON signal remains asserted to an appropriate level to keep the switch S2 turned on. In an alternative embodiment, the ON signal may be separately controlled to turn the switch S2 on or off.

The CRC signal is provided by the serial interface circuit 201 to an input of a register 203, having an output providing a current code signal to the input of a programmable current generator 205. The current generator 205 has an output coupled to one switched terminal of another SPST switch S4, having its other switched terminal coupled to the input terminal of the switch S2. Although a current generator is shown, it is understood that any suitable type of current generating device may be used. The output of the comparator A2 provides a signal CO, which is provided to an input of a control circuit 207. The control circuit 207 has another input receiving the CALCMD signal from the serial interface circuit 201. The control circuit 207 has several outputs including a first mode output providing a first mode signal M1 to the control input of the switch S4, a second mode output providing a second mode signal M2 to the control input of the switch S3, an output providing an enable signal EN to an input of a logic gate 209, an output providing a reset signal RST to the reset or "zero" input of a counter 211, and another output providing an over current detect (OCD) signal to the serial interface circuit 201. The switch circuit 103 operates in at least two modes including a normal operating mode and a calibration mode as further described below. The CO signal provided at the output of the comparator serves to indicate that calibration is achieved during calibration mode and is a maximum current signal indicating a maximum current indication during normal operating mode. The logic gate 209 has another input coupled to the output of an oscillator 213, and an output providing a clock signal CK to the input of the counter 211. The counter 211 has an output coupled to the input of a digital to analog (D/A) converter 215, which has an output providing an offset voltage OFF to an adjust input of the comparator A2. In the illustrated embodiment, the offset voltage is a differential voltage provided to a differential adjust input of the comparator A2. The oscillator 213, the logic gate 209, the counter 211 and the D/A converter 215 collectively form a calibration circuit for performing calibration as controlled by the control circuit 207 as further described below. The serial interface circuit 201 and the control circuit 207 collectively form a command interface for controlling operation of the switch circuit 103.

In the illustrated embodiment, the metering switch S2 is designed and arranged to have a resistance that is a fixed and known multiple of the resistance of the switch S1. Thus, S2 is a scaled and matching version of the switch S1. In one embodiment, this fixed resistance multiplier is independent of process variations, environmental conditions, signal level, etc. In a specific embodiment, the resistance between the switched terminals of the switch S2 is 1,000 times the resistance between the switched terminals of the switch S1. Although the switch S2 is described as a matched and scaled switch, any reference device having the desired resistance may be used. The offset voltage sources VOS1 and VOS2 are shown external to the amplifier A1 and the comparator A2, but are also drawn using dashed lines to represent the inherent offset voltages within the amplifier A1 and comparator A2, respectively. In one embodiment, the amplifier A1 is an operational amplifier having a relatively high gain, high power supply rejection ratio and high phase margin. In one embodiment, the voltage comparator A2 has a relatively high gain, a relatively high power supply rejection ratio and an auxiliary differential input for receiving the differential offset voltage OFF. The counter 211 provides a digital value (e.g., multiple-bit binary value) to the D/A 211, which is configured to generate the differential offset voltage OFF indicative of the input digital value from the counter 211. The CRC signal is provided as a multiple-bit digital code value representing a desired current value, where the received code is registered via the register 203 and provided to the input of the current generator 205. In one embodiment, the current generator 205 has a relatively high compliance voltage, high output impedance and is configured to generate an output current determined by the digital code provided from the register 203 to the switch S2 when the switch S4 is closed.

In operation of the switch circuit 103, a calibration procedure is performed during a calibration mode to generate and store an offset to measure and compensate for the offset voltages VOS1 and VOS2 of the amplifier A1 and the comparator A2, respectively. In the illustrated embodiment, the controller 107 serially communicates with the serial interface circuit 201 and causes the serial interface circuit 201 to assert a calibration command on the CSLCMD to the control circuit 207. In response, the control circuit places the switch circuit 103 in a calibration mode to perform the calibration procedure. In particular, the control circuit 207 asserts the M1 signal to open the switch S4 to prevent current from the current generator 205 being provided to the switch S2. The control circuit 207 asserts the M2 signal to cause the switch S3 to couple the A terminal to the common pole P to thus couple the input terminal 102 of the switch circuit 103 to one input of the comparator A2. The control circuit 207 asserts the RST signal to reset the counter 211. A zero output of the counter 211 is converted by the D/A converter 215 to a differential offset voltage OFF to force the offset voltage VOS2 of the comparator A2 beyond one extreme end of its dynamic range. This results in the comparator A2 assuming a predicable state. The control circuit 207 then asserts the EN signal to enable the oscillating signal at the output of the oscillator 213 to be converted by the logic gate 209 to the CK signal provided to the counter 211. The logic gate 209 may be implemented as an AND gate or a NAND gate or the like. The counter 211 increments (or decrements) with cycles of the CK signal, which causes the differential offset voltage OFF signal to ramp up (or down) towards the other end of the dynamic range of the comparator A2. The comparator A2 switches state when the value of the effective comparator offset is reached to compensate for the combined effects of the offset voltages VOS1 and VOS2. The control circuit 207 detects switching of the comparator A2 via the CO signal which then de-asserts (or negates) the EN signal to decouple the output of the oscillator from the counter 211. The counter 211 holds the resulting value which is converted by the D/A converter 215 to generate the differential offset voltage OFF to the appropriate value to compensate for, and thus minimize the effects of, the VOS1 and VOS2 offset voltages. The control circuit 207 further resets the M1 signal to close the switch S4 and resets the M2 signal to couple terminal B and the common pole P of switch S3 together to return to the normal operating mode. In this manner, the differential offset voltage OFF serves as a calibration offset voltage provided to a calibration input of the comparator A2 to effectively compensate for VOS1 and VOS2.

In normal operation of the switch circuit 103, the control circuit 207 controls the M1 signal to close switch S4 and controls the M2 signal to couple terminal B to common pole P of switch S3 together. In this manner, the input of the comparator A2 is coupled to the output rather than to the input of the switch S1. The controller 107 provides a current request code to the serial interface circuit 201, which forwards the code via the CRC signal to the register 203. The register 203 stores and provides the code to the current generator 205, which outputs a corresponding reference current. The programmed reference current is provided through switch S4 to the input of the switch S2. The output of the amplifier A1 adjusts to source or sink the programmed current through the switch S2 while maintaining the voltages at corresponding inputs of the switches S1 and S2 at the same level to within VOS1. The input to the comparator A2 is then determined as the difference between the voltages at the outputs of the switches S1 and S2 to within VOS2. As previously described, however, after the comparator A2 is calibrated, the effects of VOS1 and VOS2 are minimized so that the offset voltages may be ignored. The output signal CO of the comparator A2 indicates whether the load current I times the resistance of the switch S1, which is voltage across the switch S1, is greater than or less than the programmed reference current times the resistance of the switch S2, which is the reference voltage. Since the ratio of resistances of the switches S1 and S2 is known, the value of the programmed reference current is set to a value that allows determination of whether or not the load current I exceeds any desired or programmed value during normal operation when the switch S1 is closed. When the comparator A2 switches as detected by the control circuit 207, the control circuit 207 asserts the OCD signal to the serial interface circuit 201. The serial interface circuit 201 communicates the over current detection indication to the controller 107 via the command interface.

As an example, the controller 107 communicates via the command interface to instruct the switch circuit 103 to open the switch S1 to disconnect the power supply 101 from the load 105. The controller 107 then sends a calibration command and the current detect circuit 108 performs the calibration process to program the differential offset voltage OFF to calibrate the comparator A2 via as previously described. Then the controller 107 sends a current request code to program the register 203 of the switch circuit 103 with a corresponding current value indicative of a maximum level of the load current I. The programmed current level is based on the predetermined resistance ratio between the switches S1 and S2. In one embodiment, the resistance of S2 is 1,000 times the resistance of S1, so that the programmed current of the switch circuit 103 is 1/1,000 times the maximum value desired for the load current I. The controller 107 then instructs the switch circuit to turn on the switch S1 to couple the load 105 to the output of the power supply 101. If and when the load current I reaches the predetermined maximum value, the switch circuit 103 asserts the OCD signal which is forwarded to the controller 107 via the command interface.

A switch circuit according to one embodiment includes a first switch, a reference device, a current generating device and a comparator. The first switch has a first resistance so that a first voltage develops across the first switch when a first current is provided through it. The reference device has a second resistance which is a known multiple of the first resistance. The current generating device provides a reference current through the reference device which develops a second voltage across it. The second voltage has a level indicative of a maximum current level of the first current. The comparator compares the first and second voltages and provides a maximum current indication. An amplifier may be used to force one side of the first switch and the reference device to the same voltage, where the reference device is coupled between an input and an output of the amplifier. The comparator compares the voltage at the other side of the first switch with the output of the amplifier. The comparator may include a calibration input for receiving an offset voltage to cancel the effect of the offset voltages of the amplifier and the comparator. The current generating device may be a programmable current generator.

Although the present invention has been described in considerable detail with reference to certain preferred versions thereof, other versions and variations are possible and contemplated. For example, circuits or logic blocks described herein may be implemented as discrete circuitry or integrated circuitry or software or any alternative configurations. Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A switch circuit, comprising:
   a first switch having a first resistance, wherein a first voltage develops across said first switch when a first current is provided through said first switch;
   a reference device having a second resistance which is a known multiple of said first resistance;
   a current generating device which provides a reference current through said reference device for developing a second voltage across said reference device, wherein said second voltage has a level indicative of a maximum current level of said first current;
   a comparator which compares said first and second voltages and which provides a maximum current indication;
   an amplifier having an inverting input, a non-inverting input and an output;
   wherein said reference device has first end coupled to said inverting input and a second end coupled to said output of said amplifier;
   wherein said first switch has a first end coupled to said non-inverting input of said amplifier and has a second end; and
   wherein said comparator compares voltage levels of said output of said amplifier with said second end of said first switch.

2. The switch circuit of claim 1, wherein said reference device comprises a matched and scaled switch having said second resistance.

3. The switch circuit of claim 1, wherein said current generating device is a programmable current generator and wherein said maximum current level is a programmed current level.

4. The switch circuit of claim 1, further comprising:
   a calibration circuit which provides a calibration offset voltage; and
   wherein said comparator comprises a first input for receiving said first voltage, a second input for receiving said second voltage, and an offset input for receiving said calibration offset voltage.

5. The switch circuit of claim 4, wherein said calibration circuit comprises:
   a switch circuit which selectively decouples said current generating device from said reference device and which selectively switches said first input of said comparator from said second end to said first end of said first switch in a calibration mode;
   an offset generator which provides and adjusts said calibration offset voltage; and a control circuit which controls said switch circuit to switch to calibration mode, which monitors an output of said comparator during said calibration mode, and which commands said offset generator to adjust said calibration offset voltage until said calibration offset voltage compensates said amplifier and said comparator during said calibration mode.

6. An integrated switch device with maximum current detection, comprising:

a switch input terminal;

a switch output terminal;

a communication terminal;

an internal switch having a first end coupled to said switch input terminal and a second end coupled to said switch output terminal, wherein said switch has a first resistance which develops a first voltage when current is provided through said switch;

an internal reference device having a second resistance which is a known multiple of said first resistance;

an internal current generating device which provides a reference current through said reference device for developing a second voltage across said reference device, wherein said second voltage has a level indicative of a maximum current level of said first current;

an internal comparator which compares said first and second voltages and which has an output providing a maximum current indication when said first voltage reaches said second voltage;

an internal command interface coupled to said communication terminal and said output of said comparator, wherein said command interface asserts a maximum current signal on said communication terminal when said maximum current indication is provided;

an internal amplifier having an inverting input, a non-inverting input and an output;

wherein said reference device has first end coupled to said inverting input and a second end coupled to said output of said amplifier;

wherein said first end of said switch is coupled to said non-inverting input of said amplifier; and wherein said comparator compares voltage levels of said output of said amplifier with said second end of said switch.

7. The integrated switch device of claim 6, wherein said command interface turns on or off said switch based on a command received via said communication terminal.

8. The integrated switch device of claim 6, wherein said command interface comprises:

a communication interface coupled to said communication terminal; and a control circuit having an input coupled to an output of said comparator and an output providing an internal maximum current signal to said communication interface when said comparator provides said maximum current indication.

9. The integrated switch device of claim 6, wherein said switch comprises a plurality of metal-oxide semiconductor, field-effect transistors coupled in parallel.

10. The integrated switch device of claim 6, further comprising:

a register for storing a digital code;

wherein said current generating device comprises a programmable current generator having an input coupled to said register and an output providing said reference current at a current level indicative of said digital code; and wherein said command interface programs said register with said digital code received via said communication terminal.

11. The integrated switch device of claim 6, further comprising:

an internal calibration circuit which provides a calibration offset voltage; and wherein said comparator comprises a first input for receiving said first voltage, a second input for receiving said second voltage, and an offset input for receiving said calibration offset voltage.

12. The integrated switch device of claim 11, wherein said calibration circuit comprises:

a switch circuit which selectively decouples said current generating device from said reference device and which selectively switches said first input of said comparator from said second end to said first end of said switch in a calibration mode;

an offset generator which provides and adjusts said calibration offset voltage; and wherein said command interface comprises a control circuit which controls said switch circuit to switch to said calibration mode, which monitors an output of said comparator during said calibration mode, and which commands said offset generator to adjust said calibration offset voltage until said calibration offset voltage compensates for offset voltages of said amplifier and said comparator during said calibration mode.

13. The integrated switch device of claim 12, wherein said offset generator comprises:

an oscillator which provides an oscillating signal;

a logic circuit having an enable input, an input receiving said oscillating signal and an output for providing a clock signal when enabled;

a counter having an input receiving said clock signal, an output providing a digital value, and a reset input;

a digital to analog converter having an input receiving said digital value and an output providing said calibration offset voltage; and wherein during said calibration mode, said control circuit resets said counter and enables said logic circuit until said comparator indicates that calibration is achieved.

14. The integrated switch device of claim 13, wherein said command interface further comprises a communication interface which commands said control circuit to perform calibration in response to a calibration command received via said communication terminal.

15. A method of detecting a maximum current through a switch, comprising:

providing a reference current through a reference device to develop a reference voltage indicative of a maximum current condition of the switch;

comparing a load voltage across the switch with the reference voltage;

providing a maximum current indication if the load voltage exceeds the reference voltage;

coupling the reference device between an inverting input and output of a high gain amplifier;

coupling the non-inverting input of the high gain amplifier to an input end of the switch; and wherein said comparing comprises comparing an output of the high gain amplifier with an output end of the switch.

16. The method of claim 15, further comprising programming the reference current.

17. The method of claim 15, wherein said comparing comprises comparing using a comparator having a first input coupled to the output of the high gain amplifier and a second input coupled to the output end of the switch.

18. The method of claim 17, further comprising:
providing a calibration input of the comparator;
decoupling the second input of the comparator from the output end of the switch and coupling the second input of the comparator to the input end of the switch;
providing a calibration voltage to the calibration input of the comparator while monitoring an output of the comparator; and
adjusting the calibration voltage until the output of the comparator indicates calibration.

* * * * *